United States Patent [19]

Partin et al.

[11] Patent Number: 4,978,938

[45] Date of Patent: Dec. 18, 1990

[54] MAGNETORESISTOR

[75] Inventors: Dale L. Partin, Sterling Heights; Joseph P. Heremans, Troy; Donald T. Morelli, Walled Lake, all of Mich.

[73] Assignee: General Motors Corporation, Detroit, Mich.

[21] Appl. No.: 426,245

[22] Filed: Oct. 25, 1989

Related U.S. Application Data

[63] Continuation-in-part of Ser. No. 289,646, Dec. 23, 1988, abandoned.

[51] Int. Cl.$^5$ ............................................. H01L 43/00
[52] U.S. Cl. ..................................... 338/32 R; 357/27
[58] Field of Search ................... 338/32 R; 357/27, 5, 357/63, 51

[56] References Cited

U.S. PATENT DOCUMENTS 3,898,359  8/1975  Nadkerni ............................ 428/209
4,224,594  9/1980  Anthony et al. .................. 338/32 R

OTHER PUBLICATIONS

S. Kataoka, "Recent Developments of Magnetoresistive Devices and Applications," *Circulars of the Electrotechnical Laboratory No. 182*, Agency of Industrial Science and Technology, Tokyo (Dec. 1974).

H. H. Wieder, "Transport Coefficients of Indium Arsenide Epilayers," *Applied Physics Letters*, vol. 25, No. 4, pp. 206–208 (Aug. 15, 1974).

G. Burns, *Solid State Physics Sections 18-5 and 18-6*, pp. 726–747, Academic Press, Inc., Harcourt Brace Jovanovich, Publishers, New York, 1985.

H. P. Baltes and R. S. Popovic, "Integrated Semiconductor Magnetic Field Sensors," *Proceedings of the IEEE*, vol. 74, No. 8, pp. 1107–1132 (Aug. 1986).

S. Kalem, J.-I. Chyi and H. Morkoc, "Growth and Transport Properties of InAs Epilayers on GaAs," *Applied Physics Letters*, vol. 53, No. 17, pp. 1647–1649 (Oct. 24, 1988).

*Primary Examiner*—Bruce A. Reynolds
*Assistant Examiner*—Marvin M. Lateef
*Attorney, Agent, or Firm*—Robert J. Wallace

[57] ABSTRACT

A magnetoresistive sensor that includes a very thin film of monocrystalline semiconductive material, having at least a moderate carrier mobility and no greater than a moderate carrier density. The device includes means for inducing or enhancing an accumulation layer adjacent the film outer surface. With film thicknesses below 5 micrometers, preferably below 3 micrometers, the presence of the accumulation layer can have a very noticeable effect. The unexpected improvement provides a significant apparent increase in mobility and conductivity of the semiconductive material, and an actual increase in magnetic sensitivity and temperature insensitivity. A method for making the sensor is also described.

17 Claims, 7 Drawing Sheets

FIG. 3

FIG. 4
MAGNETORESISTOR InAs/InP
SENSISTIVITY AT 0.4 Tesla

FIG. 5
MAGNETORESISTOR InAs/InP

MAGNETORESISTOR

CROSS-REFERENCE

This is a continuation-in-part of our pending U.S. patent application Ser. No. 289,646, filed Dec. 23, 1988 now abandoned.

COPENDING PATENT APPLICATIONS

This patent application is related to the following concurrently filed U.S. patent applications, which are assigned to the same assignee to which this patent application is assigned:

Ser. No. 289,634, filed Dec. 23, 1988 entitled, "Indium Arsenide Magnetoresistor," and filed in the names of Joseph P. Heremans and Dale L. Partin; and Ser. No. 289,641, filed Dec. 23, 1988, entitled, "Improved Position Sensor," and filed in the names of Donald T. Morelli, Joseph P. Heremans, Dale L. Partin, Christopher M. Thrush and Louis Green. Continuations-in-part of both of the foregoing concurrently filed applications are being filed with this application.

This patent application is also related to the following earlier filed U.S. patent application, which also is assigned to the assignee of this invention;

Ser. No. 229,396 entitled, "Position Sensor," and filed in the names of Thaddeus Schroeder and Bruno P. B. Lequesne on Aug. 8, 1988.

While not believed to relate specifically to the invention claimed herein, the following copending U.S. patent applications are mentioned because they also relate to magnetic field sensors and are assigned to the assignee of this patent application:

Ser. No. 181,758 entitled, "Magnetic Field Sensor," and filed Apr. 14, 1988 in the names of Dale L. Partin and Joseph P. Heremans, now U.S. Pat. No. 4,843,444; and Ser. No. 240,778 entitled, "Magnetic Field Sensors," and filed Sept. 6, 1988 in the names of Joseph P. Heremans and Dale L. Partin.

FIELD OF THE INVENTION

This invention relates to magnetic field sensors and, more particularly, to improved thin film magnetoresistors and to methods of making such a magnetoresistor.

BACKGROUND OF THE INVENTION

In the past, magnetoresistors were believed to be best formed from high carrier mobility semiconductive material in order to get the highest magnetic sensitivity. Hence, the focus was on making magnetoresistors from bulk materials that were thinned down or on films having sufficient thickness to exhibit a high average mobility.

We have found a new way to approach making magnetoresistors. We have found that if an accumulation layer is induced in the surface of an extremely thin film of semiconductive material, the properties of the accumulation layer relevant to magnetic sensitivity can dominate over those of the remainder of the film.

Such accumulation layers can make higher band gap semiconductor materials useful in magnetosensors. Such materials can be used at higher operating temperatures than lower band gap semiconductive material, such as indium antimonide. However, it may even enhance the sensitivity of indium antimonide enough to allow it to be used at higher temperatures.

SUMMARY OF THE INVENTION

This invention is directed to a magnetoresistor formed in a semiconductor film having an artificially induced accumulation layer of current carriers, and in which the magnetic change in conductivity of the artificially induced accumulation layer is not masked by conductivity of the balance of the film. The accumulation layer can be of the same conductivity type as that of the film or of opposite conductivity type. An opposite conductivity type accumulation layer is also referred to as an inversion layer but is considered to be within the scope of the phrase "accumulation layer" as used in this patent application. The semiconductor film has a carrier mobility of at least about 5,000 $cm^2V^{-1}sec^{-1}$ and a volume carrier density in the bulk of the film that is moderate to low.

This description emphasizes use of an accumulation layer in magnetoresistors made of higher band gap semiconductive materials. However, an artificially induced accumulation layer is expected to be beneficial in magnetoresistors made of still other semiconductive materials; e.g., indium antimonide.

This invention is also directed to new magnetoresistor constructions and methods of making magnetoresistors.

The invention will be better understood from the following detailed description taken with the accompanying drawings and claims.

BRIEF DESCRIPTION OF THE DRAWINGS

FIGS. 11A, 11B, and 11C are schematic views showing a magnetoresistor having a gate electrode over each of a plurality of sensing areas to electrically induce an accumulation layer in each sensing area. In FIGS. 11B and 11C, the gate electrodes are electrically biased internally, by two different techniques.

The drawings are not to scale.

DETAILED DESCRIPTION

Figure 1A:
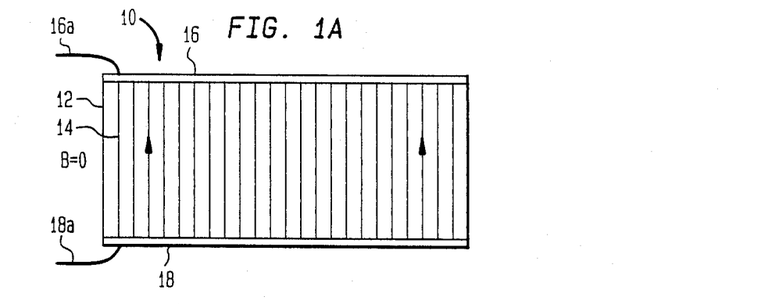
FIG. 1A is a schematic view of a magnetoresistor, showing its electrical current flow lines when no magnetic field is applied to it.

Referring to FIG. 1A, a typical magnetoresistor element 10 comprises a slab (substrate, body) 12 of semiconductor, typically rectangular in shape, through which a current is passed. Such a magnetoresistor is described by S. Kataoka in "Recent Development of Magnetoresistive Devices and Applications," *Circulars of Electrotechnical Laboratory*, No. 182, Agency of Industrial Science and Technology, Tokyo (Dec. 1974).

In the absence of magnetic field, the current lines 14 go from one injecting electrode 16 to another electrode 18 in parallel lines (see FIG. 1A). This flow is between electrodes 16 and 18 along the top and bottom edges of the rectangular slab 12 in FIG. 1A. Bonding wires (contacts) 16a and 18a are connected to electrodes 16 and 18, respectively. The geometry (a rectangle in our example) of slab 32 is chosen so that an applied magnetic field, perpendicular to the slab, increases the current line trajectory (see FIG. 1B). The magnetic field perpendicular to the plane of the paper thus lengthens the current flow lines. The longer length leads to higher electrical resistance, so long as the resulting lateral voltage difference is electrically shorted, as shown, by the top and bottom edge electrodes 16 and 18.

Figure 1B:
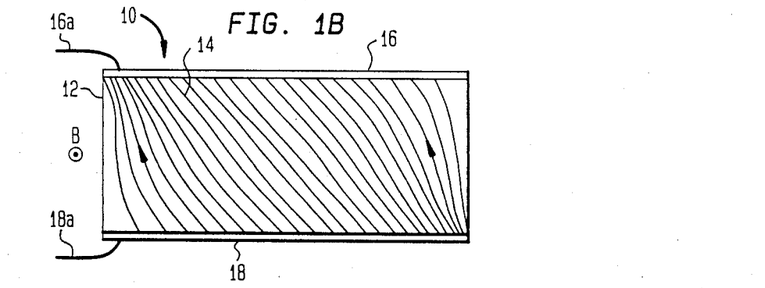
FIG. 1B is a schematic view of a magnetoresistor, showing how the electrical current flow lines are redirected in the plane of its major surface when a magnetic field is applied perpendicular to that surface.

FIG. 1B shows how the electrical current flow lines through slab 32 are redirected when a magnetic field B (shown as a B with a circle having a dot in the center thereof) and coming out of the page is applied perpendicular to slab 32.

The best geometry for this effect to occur is one where the current injecting electrodes are along the longest side of the rectangle, and the ratio of this dimension ("width") to the shortest dimension ("length") is as large as possible. Preferably, the length of the shortest side is 10% to 60% of the length of the longest side, and, more preferably, 20% to 40% of the length of the longest side. Such an optimal device geometry hence leads to a very low resistance. Kataoka teaches that the magnetic field sensitivity of such devices is best when the devices are made out of semiconductors with as large a carrier mobility as possible. The resistivity of such devices is made less temperature-dependent when the semiconductor material contains a large donor concentration, giving a large carrier density. These last two constraints imply that semiconductors with high electrical conductivity are best suited for practical applications.

Figure 2:
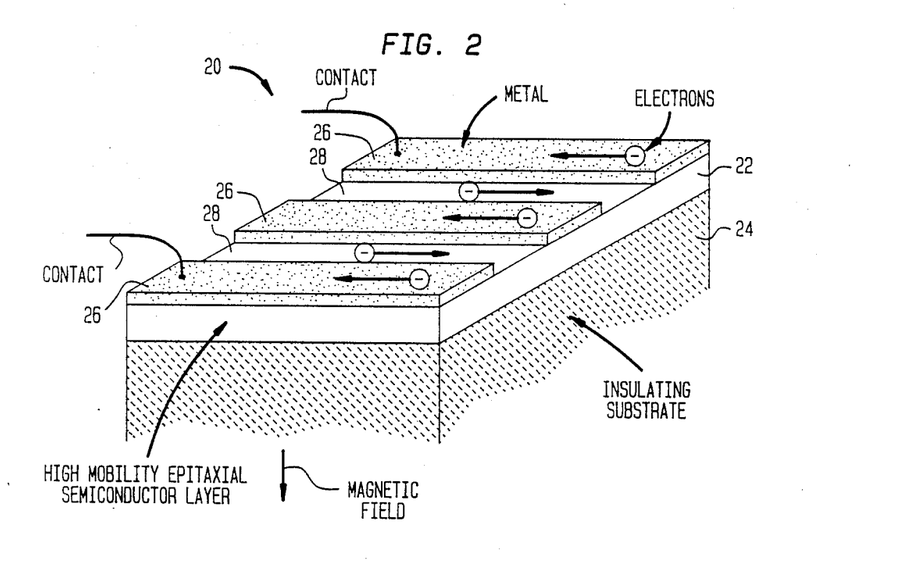
FIG. 2 is an isometric view showing a magnetoresistor having two integral sensing areas electrically in parallel.

Combined with the geometrical restrictions described earlier, one can deduce that the final magnetoresistor element will have a low resistance. This has a practical drawback. Under a constant voltage, the power dissipated by the device scales as the inverse of the resistance. To limit ohmic heating (which would limit the operational temperature range of the sensor, if not destroy the sensor itself) while maintaining a large voltage output during sensor interrogation, it is desirable that a magnetoresistive element have a resistance around 1,000 ohms. However, a resistance of about 300 ohms to about 6,000 ohms is acceptable in many applications. A number of ways have been proposed to achieve such resistances. For example, as Kataoka has pointed out, one can put a number of elementary devices in series. Making a plurality of sensing areas as integral parts of a single element is shown in FIG. 2, which shows a plurality of magnetoresistors 20 formed in an epitaxial layer 22 which is on a substrate 24. Spaced-apart electrodes 26 are on a top surface of epitaxial layer 22. While only two sensing areas (i.e., devices) are shown, one could make an element with tens or hundreds of integral sensing areas (i.e., devices).

If the metal-semiconductor (magnetic-field independent) interfacial contact resistance of one such elementary device is an appreciable fraction of the semiconductor resistance of this elementary device, it will lower the sensitivity to a magnetic field. Thus, metals must be deposited which have a very low metal-semiconductor interfacial contact resistance to avoid this sensitivity degradation. In most cases, we would prefer that the interfacial contact resistance between the sensing area and its electrodes be 10-100 times less than the resistance of the sensing area between those electrodes. Another option which alleviates the problem of low magnetoresistor device resistance has been to use active layers that are as thin as possible. This has been done by thinning wafers of indium antimonide (InSb), which were sliced from bulk ingots, down to thicknesses as small as 10 microns. The wafer thinning process is a very difficult process, since any residual damage from the thinning process will lower the electron mobility. Reducing electron mobility will decrease the sensitivity to a magnetic field of devices made from this material.

Another approach has been to deposit films of InSb onto an insulating substrate. On the other hand, in this latter case, the electron mobility of the resulting films is reduced to a fraction of that of bulk InSb. This reduction occurs because of defects in the film. With typical mobilities of 20,000 cm$^2$V$^{-1}$sec$^{-1}$, these films produce devices with greatly reduced sensitivity to a magnetic field compared to devices made from bulk InSb. As shown in FIG. 2, usual magnetoresistors 20 made from a film includes an epitaxial layer 22 of the semiconductor material on the surface of an insulating substrate 24. Spaced-apart metal electrodes 26 are on the substrate layer 22 and extend thereacross to form rectangular action regions 28 of the semiconductor layer 22 therebetween. As shown, the magnetoresistor 20 includes two active regions 28.

The great majority of the prior work until now has focused on InSb. This can be understood from the data in the following Table I.

TABLE I

| Potential Magnetoresistor Materials at 300K. | | | |
|---|---|---|---|
| Semi-conductive Material | Maximum Electron Mobility (cm$^2$V$^{-1}$sec$^{-1}$) | Crystal Lattice Constant (A) | Energy Band Gap (eV) |
| InSb | 78,000 | 6.478 | 0.17 |
| Bi$_{1-x}$Sb$_x$ (x < 0.2) | 32,000 | 6.429(Bi) | 0–0.02 |
| InAs | 32,000 | 6.058 | 0.36 |
| In$_{0.53}$Ga$_{0.47}$As (on InP) | 14,000 | 5.869 | 0.75 |
| GaAs | 8,000 | 5.654 | 1.4 |
| GaSb | 5,000 | 6.095 | 0.68 |

TABLE I-continued

| | Potential Magnetoresistor Materials at 300K. | | |
|---|---|---|---|
| Semi-conductive Material | Maximum Electron Mobility $(cm^2V^{-1}sec^{-1})$ | Crystal Lattice Constant (A) | Energy Band Gap (eV) |
| InP | 4,500 | 5.869 | 1.27 |

For these III-V compounds, e.g., indium arsenide, the energy band gap decreases with increasing temperature.

Since the magnetoresistance effect is proportional to electron mobility squared for small magnetic fields, InSb is highly preferable. However, the difficulty of growing compound semiconductors in general, and the fact that there is no suitable, lattice-matched, insulating substrate upon which it may be grown, led us to try growing Bi films. Such work has been previously reported by Partin et al. in *Physical Reviews B*, 38, 3818-3824 (1988) and by Heremans et al. in *Physical Reviews B*, 38, 10280-10284 (1988). Although we succeeded in growing the first epitaxial Bi thin films, with mobilities as high as 25,000 $cm^2V^{-1}sec^{-1}$ at 300 K and 27,000 $cm^2V^{-1}sec^{-1}$ for $Bi_{1-x}Sb_x$ at 300K, magnetoresistors made from these films had very low sensitivities. Modeling studies which we have just completed indicate that this is, to our knowledge, an unrecognized effect of the fact that the energy band structure of Bi has several degenerate conduction band minima. Other high mobility materials shown in Table I have a single, non-degenerate conduction band minimum. We then began growing InSb thin films (on semi-insulating GaAs substrates) using the metal organic chemical vapor deposition (MOCVD) growth technique. After many months of effort, we could only produce films with electron mobilities of 5,000 $cm^2V^{-1}sec^{-1}$.

However, we have found that good magnetoresistors can be formed of a thin film of a semiconductor material having a band gap of about 0.36 electron volt, such as indium arsenide (InAs), on a semi-insulating substrate. By "semi-insulating," it is meant that the substrate has such a high resistivity as to be substantially insulating. Preferably, the semiconductor film should be of a thickness of less than about 3 micrometers, although films of a thickness of about 5 micrometers will form satisfactory magnetoresistors. The semiconductor film should have an accumulation layer along its surface with the areal electron density of the surface accumulation layer being substantially larger, at least an order of magnitude larger, than the areal electron density of the bulk of the layer. The bulk density of the layer is generally in the order of $10^{16}$ electrons per cubic centimeter or lower. The film should be of a good crystalline quality having a high average electron mobility, 10,000 to 32,000 square centimeters per volt per second. The electron accumulation layer is effective to provide a magnetic conductivity and range of operating temperatures as if the semiconductor film was apparently much thinner and had a much higher electron density and electron mobility.

We grew indium arsenide (InAs) on semi-insulating GaAs, and also on semi-insulating InP substrates. These latter substrates were made semi-insulating by doping them with Fe. They were tried in addition to GaAs because there is less lattice mismatch with InAs (see Table I). After some time, we were able to produce InAs films with a room temperature mobility of 13,000 $cm^2V^{-1}sec^{-1}$ on InP substrates, and of lower mobility on GaAs substrates. The better InAs films were formed by the following process.

An MOCVD reactor manufactured by Emcore Corporation was used. InP substrates were heated to the growth temperature in an atmosphere of 40 torr of high purity (Palladium diffused) hydrogen to which a moderate quantity of arsine was added (80 SCCM, or standard cubic centimeters per minute). This produced about 0.02 mole fraction of arsine. The arsine was used to retard thermal decomposition of the InP surface caused by loss of the more volatile phosphorus. The way in which arsine reduces the surface roughening during this process is not well understood. Phosphine would have been preferred, but was not available at the time in our reactor. After reaching a temperature of 600° C., the arsine flow was reduced to 7 SCCM, and ethyl-dimethyl indium (EDMIn) was introduced to the growth chamber by bubbling high purity hydrogen (100 SCCM) through EDMIn which was held at 40° C. Higher or lower arsine flows during growth gave lower mobilities and worse surface morphologies. After 2.5 hours of InAs growth time, the EDMIn flow to the growth chamber was stopped and the samples were cooled to room temperature in an arsine-rich atmosphere (as during heat-up).

The thickness of the resulting InAs film was 2.3 micrometers. From conventional Hall effect measurements at 300K, the electron density was $1.4 \times 10^{16}$ $cm^{-3}$ and the electron mobility was 13,000 $cm^2V^{-1}sec^1$. These are effectively averages since the electron density and mobility may vary within a film. The film was not intentionally doped. Even though this is a very disappointing mobility, a crude magnetoresistor was made, since this required very little effort. A rectangular sample was cleaved from the growth and In metal was hand-soldered along two opposing edges of the sample, and leads were connected to the In. The length, which is the vertical dimension in FIGS. 1A and 1B, was 2 mm, and the width, which was the horizontal dimension in FIGS. 1A and 1B, was 5 mm.

Figure 3:
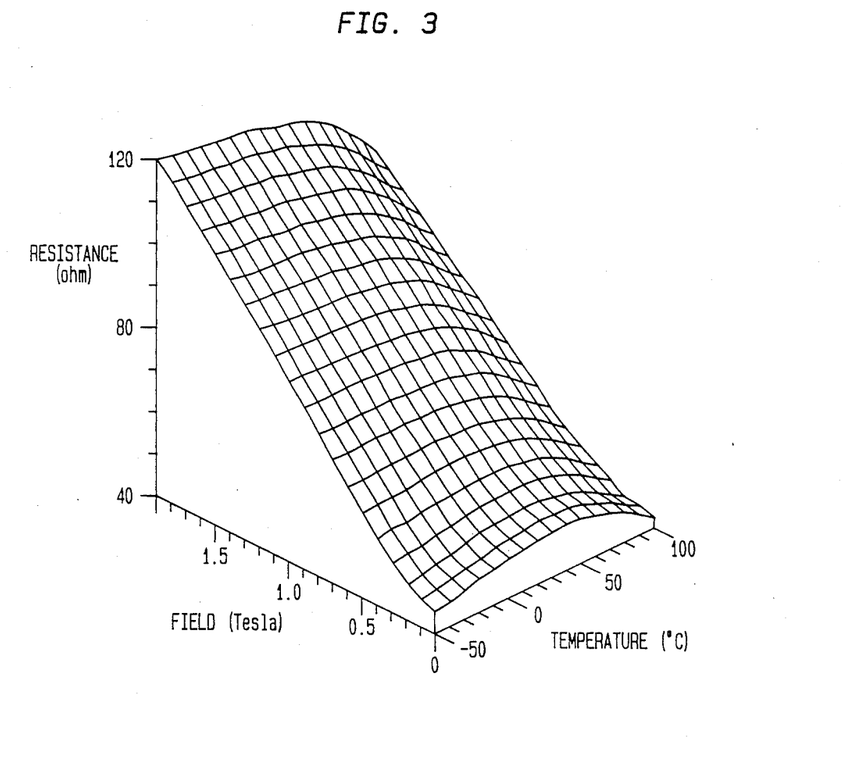
FIG. 3 is a three-dimensional or contour plot showing the change of electrical resistance in a single element larger band gap semiconductor magnetoresistor with changes in temperature and magnetic field strength.

FIG. 3 graphically shows a three-dimensional or contour plot showing the change of electrical resistance in a single element larger band gap semiconductor magnetoresistor with changes in temperature and magnetic field strength.

Figure 4:
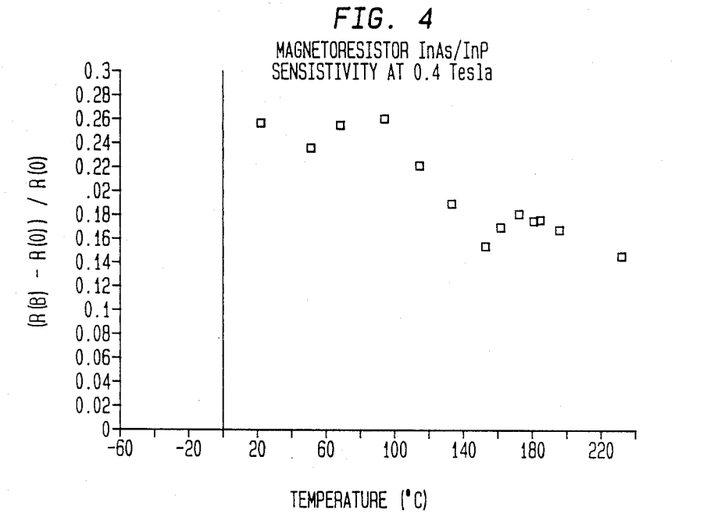
FIG. 4 is a two-dimensional plot of the fractional magnetoresistance over a wider temperature range than shown in FIG. 3.
Figure 5:
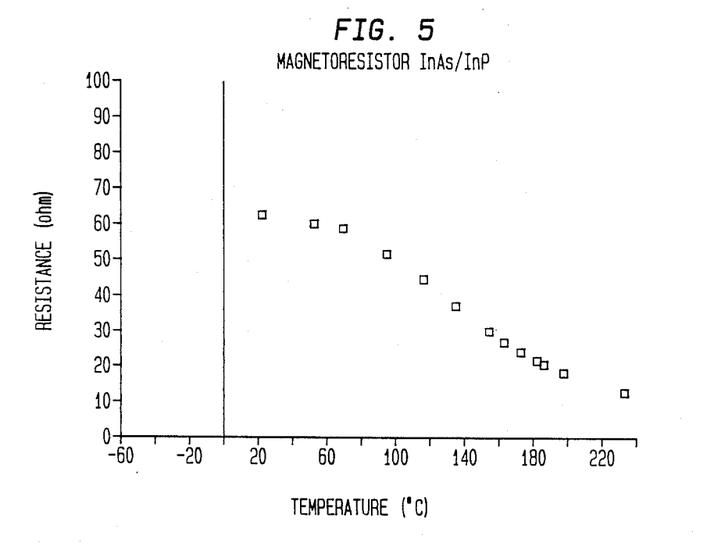
FIG. 5 is a two-dimensional plot showing change in resistance with no magnetic field applied over a wider temperature range than shown in FIG. 3.

As expected, the resistance of the device was low (about 50 ohms) since we did not have many elements in series. However, the magnetoresistance effect was large. It is shown in FIG. 3. Furthermore, the device resistance and magnetoresistance were surprisingly stable with temperatures in the range shown in FIG. 3, which is −50° C. to +100° C. A second, similar device was tested less thoroughly at temperatures as high as +230° C. FIG. 4 graphically shows a two-dimensional plot of the fractional magnetoresistance over a wider temperature range than shown in FIG. 3. FIG. 5 graphically shows a two-dimensional plot showing change in resistance with no magnetic field applied over a wider temperature range than shown in FIG. 3. The results of this latter testing are shown in FIGS. 4 and 5. In FIG. 4, the applied magnetic field was 0.4 Tesla. The fractional magnetoresistance is plotted as a function of temperature between B=0.4 Tesla and B=0. Despite the fact that the indium metal used for contacts has a melting point of 156° C., the magnetoresistor still functioned very surprisingly well at 230° C., with the fractional increase in resistance for a given magnetic field (0.4

Tesla) reduced by less than one-half compared to the response near room temperature (as shown in FIG. 4).

The device resistance in zero magnetic field, R(O), decreased over the same temperature range by a factor of 5 (as shown in FIG. 5). We also found this to be surprisingly good, even taking into account the relatively large energy gap of InAs.

Our own detailed analysis of transport data from these films suggests that there are current carriers with two different mobilities present. In retrospect, it looks like our results are related to an accumulation layer of electrons at the surface of the sensing layer. We have now found that Wieder has reported in *Appl. Phys. Letters*, 25, 206 (1974) that such an accumulation layer exists just inside the InAs near the air/InAs interface. There appear to us to be some errors in the Weider report. However, we think that the basic conclusion that an electron accumulation layer exists is correct. These electrons are spatially separated from the positive charge at the air/InAs interface. Thus, they are scattered relatively little by this charge, resulting in a higher mobility than would normally be the case. They also exist in a very high density in such an accumulation layer, so that as the temperature increases, the density of thermally generated carriers is a relatively small fraction of the density in the accumulation layer. This helps stabilize the resistance (at zero magnetic field) with temperature. Thus, it appears that the relatively low measured electron mobility of 13,000 $cm^2 V^{-1} sec^{-1}$ is an average for electrons in the accumulation layer and for those in the remainder of the thickness of the film.

Thus, normally one would want to grow a relatively thick layer of InAs to make a good magnetoresistor, since crystal quality (and mobility) generally improve with thickness when growing on a lattice-mismatched substrate. However, the thicker the layer becomes, the greater its conductivity becomes and the less apparent the benefits or presence of a surface accumulation layer would be. Thus, our current understanding of our devices suggests that relatively thinner layers are preferable, even if the average film mobility decreases somewhat, since this will make the conductivity of the surface accumulation layer a greater fraction of the total film conductivity. The exact relationships between film thickness, crystal quality and properties of the surface accumulation layer are currently under study.

Figure 6:
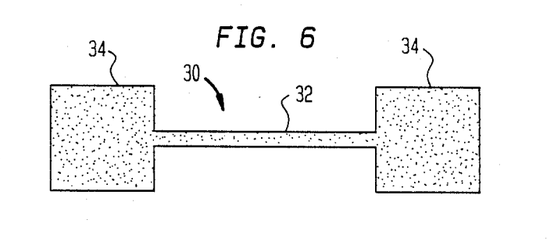
FIG. 6 is an elevational view showing a semiconductor film in a pattern for providing a series connected plurality of sensing areas integrated in a single magnetoresistor.
Figure 7A:
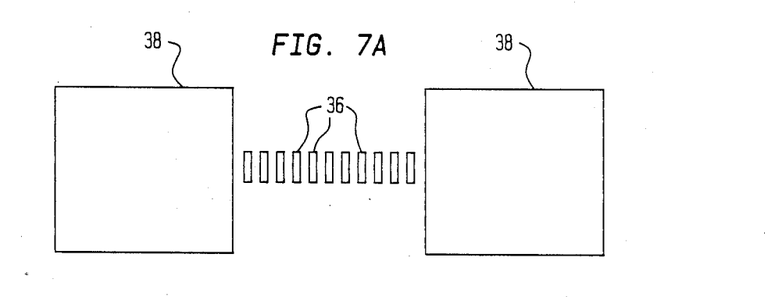
FIG. 7A is an elevational view showing a metallization pattern for superposition on the pattern of FIG. 6.
Figure 7B:
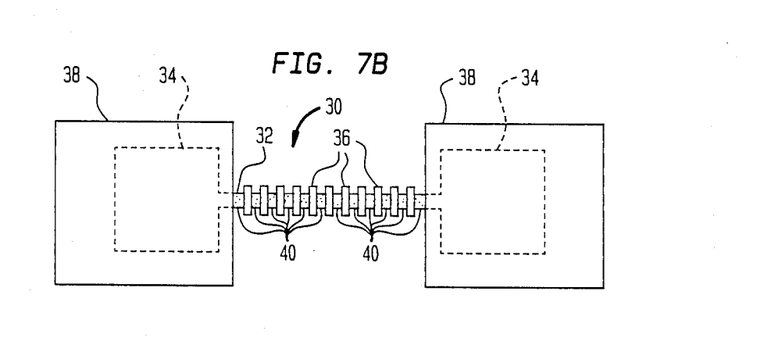
FIG. 7B is an elevational view showing the metallization pattern of FIG. 7A superimposed on the pattern of FIG. 6 to delineate the plurality of sensing areas.

We have since made multi-element magnetoresistors from this material using Au (or Sn) metallization. First, conventional photolithography techniques were used to etch away unwanted areas of an indium arsenide (InAs) film from the surface of the indium phosphide (InP) substrate to delineate the pattern shown in FIG. 6. The delineated film 30 is in the form of a dumbbell having an elongated portion 32 with enlarged portions 34 at each end thereof. A dilute solution (0.5%) of bromine in methanol was used to etch the InAs. Then, a blanket layer of Au metallization 1000 Angstroms thick was deposited using conventional vacuum evaporation techniques over the entire surface of the sample, after removing the photoresist. Conventional photolithography was then used to etch away unwanted areas of the Au film to delineate the gold pattern shown in FIG. 7A. The gold pattern includes a plurality of small, spaced-apart electrodes 36 arranged in a row and a large electrode 38 at each end of the row of small electrodes 36. A dilute aqueous solution of KCN was used for this step. We think dissolved oxygen is helpful. It can diffuse into the solution from ambient air or be supplied in the form of a very small addition of hydrogen peroxide. The resultant composite of the two patterns, with the gold pattern overlying the InAs film pattern, is shown in FIG. 7B where the electrodes 36 extend across the elongated portion 32 of the film 30 and the large electrodes 38 cover the enlarged end portion 34 of the film 30. The electrodes 36 delineate the elongated portion 32 into active regions 40 and the large electrodes 38 serve as bonding pads.

Figure 8:
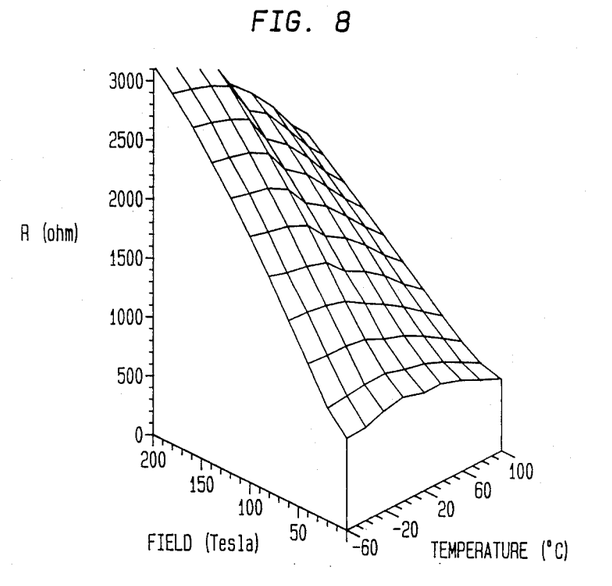
FIG. 8 is a three-dimensional or contour plot showing the change of electrical resistance of a multiple sensing area magnetoresistor such as shown in FIG. 7B.

Leads (not shown) were then attached by silver epoxy to the large Au end bonding pads 38. Leads could also be attached by normal and accepted filamentary wire bonding techniques. If so, and especially if a modern wire bonding apparatus were used, the bonding pads could easily be made much smaller. Also, many devices such as shown in FIGS. 6, 7A and 7B could be made simultaneously using conventional integrated circuit technology. The resulting devices typically have a resistance near 1,000 ohms (typically + or − 20%) at room temperature in zero magnetic field. Surprisingly, the magnetoresistance effect on the multisensing area device was much larger than the effect on a single sensing area device. FIG. 8 graphically shows a three-dimensional or contour plot showing the change of electrical resistance of a multiple sensing area magnetoresistor such as shown in FIG. 7B. For comparison of these effects at a given magnetic field, see FIGS. 8 and 3. In the multi-element device (i.e., plural sensing area element), the sensing areas had a length-to-width ratio of 2/5. We do not understand why the multi-element device works better since the length-to-width ratio of each element is 2/5, the same as for the single element device characterized in FIG. 3, which was fabricated using part of the same InAs grown layer. Another multi-element magnetoresistor was made similarly to the one just described, but with a length-to-width ratio of 4/5. It had nearly as large a magnetoresistance as the one made according to the patterns in FIGS. 4 and 5. Again, we do not yet understand this, but the resulting devices work very well. Even a device with a length-to-width ratio of 6/5 works well.

The relative stability of these magnetoresistors with temperature also now appears to be increasingly important, since some automotive applications require operation from −50° C. to as high as +170° C. to +200° C., and there are known applications requiring even higher temperatures (to 300° C.). There is reason to believe that our invention will provide magnetoresistors operating at temperatures as high as 300° C., and even higher.

A potential problem with InAs magnetoresistors made in accordance with this invention is the potential importance of the air/InAs interface, which might cause the device characteristics to be sensitive to changes in the composition of ambient air, or cause the characteristics to slowly change with time or thermal history because of continued oxidation of the surface. We have tried coating the surfaces of two devices with a particular epoxy made by Emerson and Cuming, a division of Grace Co. The epoxy we used was "Stycast," number 1267. Parts A and B were mixed, applied to the devices, and cured at 70° C. for two hours. We did not observe any significant changes in the device characteristics at room temperature as a result of this encapsulation process. We have not yet systematically tested these devices at other temperatures, but we are encouraged by this preliminary result. We think other forms of encapsulants need to be explored, such as other epoxies and thin film dielectrics, such as $SiO_2$ or $Si_3N_4$.

Since exactly what occurs at the air/InAs interface which causes the accumulation layer is not yet known, one thing we intend to explore is depositing a thin film of dielectric or high energy gap semiconductor (such as GaAs, $In_{1-x}Ga_xAs$, $In_{1-x}Al_xAs$, or AlSb) right after growth of the InAs is complete, and before exposure to air. We hope that this will still result in an accumulation layer at the interface between InAs and the dielectric or high energy gap semiconductor.

In order to still have a very low metal-semiconductor contact resistance between the InAs and the contact and shorting bar metallization, it may be necessary to modify the processing sequence previously described in connection with FIGS. 6, 7A and 7B. For example, with an inverse of the mask contemplated in the previous discussion, the photoresist on the surface could then be used as a mask for wet etching (e.g., by wet chemicals or reactive ions, or ion beams) of the dielectric or high energy gap semiconductor layer to expose the InAs. Au or other metals could then be deposited by vacuum evaporation (or by other conventional processes, such as sputtering, electroplating, etc.) and then the photoresist could be removed, resulting in lift-off of the undesired regions of metal. Alternatively, after etching through to the InAs, the photoresist could be removed. Au or other metal could then be deposited uniformly across the surface, and, after deposition of photoresist, the mask pattern in FIG. 7A could be aligned with the pattern etched into the dielectric. Then, the Au could be patterned as before.

As an additional alternative, if a sufficiently thin layer (e.g., 200 Angstroms) of high energy gap semiconductor is present, the original processing sequence described could be modified by deposition of a low melting temperature eutectic alloy, such as Au-Ge, Au-Ge-Ni, Ag-Sn, etc., in place of Au. After patterning similarly to the way Au was (or using the inverse of the mask in FIG. 7A and lift-off), the sample is heated to a moderate temperature, typically to somewhere in the range of 360° C. to 500° C. for Au-Ge based alloys, thus allowing the liquid metal to locally dissolve the thin layer of high energy gap semiconductor, effectively contacting the InAs.

In our most recent work, we have changed our InAs growth procedures somewhat. The procedures are the same as before, but the InP wafer is heated to 460° C. in a larger arsine mole fraction (0.1). After 0.5 minutes at 460° C., during which the native oxide on InP is believed to desorb, the temperature is lowered to 400° C. and 200 Angstroms of InAs thickness is grown. The temperature is then raised to the growth temperature of 625° C. (with the arsine mole fraction still 0.1), and then EDMIn is introduced while the arsine flow is abruptly reduced to 5 SCCM (about 0.001 mole fraction). The EDMIn is kept at 50° C., and the high purity hydrogen is bubbling through it at a rate of 75 SCCM. Again, the arsine flow of 5 SCCM seems near-optimal for these growth conditions. The resulting films have somewhat enhanced sensitivity to a magnetic field relative to those grown earlier.

While all of our initial work concentrated on magnetoresistors fabricated from InAs films on semi-insulating (i.e., substantially electrically insulating) InP substrates, we think that a more mature growth capability will permit films of InAs with nearly comparable quality to be grown on semi-insulating GaAs substrates as well. In either case, other growth techniques, such as molecular beam epitaxy liquid phase epitaxy or chloride-transport vapor phase epitaxy, may also prove useful.

We are describing and claiming the above-mentioned indium arsenide (InAs) thin film devices, fabrication processes, and operating characteristics in a separate U.S. patent application Ser. No. 289,634, filed Dec. 23, 1988, entitled, "Indium Arsenide Magnetoresistor," in the names of J. P. Heremans and D. L. Partin. A continuation-in-part of U.S. patent application Ser. No. 289,634 is being filed concurrently with this patent application.

On the other hand, we think that the presence of what may be a naturally occurring accumulation layer in the above-mentioned thin film InAs magnetoresistors is what makes them work so well, and which enabled production of a practical device. We believe that this fundamental concept is new to magnetoresistors, and that this thought can be expanded in a multiplicity of ways, not only to indium arsenide, but to other semiconductive materials as well, including lower band gap materials such as indium antimonide. In this patent application, we further describe and claim a variety of techniques by which an accumulation layer can be artificially induced in the semiconductor layer, e.g., by other than a natural occurrence or inherent occurrence as a result of the fabrication process.

The following discussion describes some of the artificial ways of inducing or enhancing an electron accumulation or inversion layer in InAs thin films and in other semiconductive materials in thin film form, to attain effective high mobilities. There are three basic advantages to the use of strong electron accumulation layers in magnetoresistor active regions. It is repeated here that the term electron accumulation layer, as used in this patent application, is also intended to include electron inversion layers.

First, electron accumulation layers or strong electron inversion layers can contain a density of electrons significantly larger than the intrinsic density at any given temperature. This must improve the temperature stability, since the thermally excited carriers are a small fraction of the accumulated or strongly inverted ones.

Second, accumulation layers enhance the mobility of the carriers in the semiconductor. This effect has been experimentally observed in thin indium arsenide (InAs) films, especially at higher temperatures. They will enhance the sensitivity of the magnetoresistor. One possible cause of this effect may be that in such accumulated or strongly inverted layers, large electron densities can be achieved without the presence of a large density of ionized impurities in the same spatial region, which would limit the carrier mobility. This effect is similar to the "modulation doping" of layers described by G. Burns in *Solid State Physics*, pp. 726–747, Academic Press (1985). Such an effect is used in the fabrication of High-Electron-Mobility-Transistors (HEMTs).

Third, accumulation or strong inversion layers are inherently close to the surface or interface of a semiconductor. This makes it relatively easy to induce, enhance, or control these accumulation or strong inversion layers through the use of thin film structures deposited on top of the semiconductor, possibly in combination with voltage biases.

Accumulation layers have been used in silicon MOSFET Hall plates, and is described by H. P. Baltes et al. in *Proc. IEEE*, 74, pp. 1107–1132, especially pp. 1116-7, (1986). In the MOSFET Hall effect devices, a biased gate electrode in a Metal-Oxide-Semiconductor was used to generate a suitably thin electron layer close to the Semiconductor-Oxide interface. Four electrodes were then used to contact that layer: a source and a drain through which current is passed, and two intermediate electrodes across which the Hall voltage is generated. Further, Baltes et al., ibid, also describe a split-drain MOSFET using an accumulation-layer based sensor with only four electrodes (one source, two drains, and one gate). One of the virtues of a magnetoresistor over a Hall effect device is that the magnetoresistor has only two electrodes. In order to preserve this in our improved magnetoresistor concept, we propose to use, in conjunction with a magnetoresistor layout such as described in FIG. 2, a number of new ways to generate accumulation or inversion layers without using externally biased gate electrodes.

In a first embodiment, we make use of the fact that the natural interface between InAs and air is known to generate an electron accumulation layer in InAs. A naturally occurring accumulation layer may exist in InSb, and the technique may, therefore, be applicable to thin film magnetoresistors made with this semiconductor material. We would, however, not expect InSb devices to work as well as InAs at very high temperatures. The very small energy gap of InSb (see Table I) would cause thermal generation of carriers that would cause increased conductivity in the InSb film adjacent to the accumulation layer, making the conductivity of the accumulation layer a relatively small fraction of the total device conductivity. Thus, the benefits of an accumulation layer would be lost at a lower temperature in InSb than in the higher energy band gap InAs. However, at lower temperatures, an artificially induced accumulation layer will most likely enhance magnetic sensitivity of InSb. This enhancement may be very useful in applications not subjected to especially high temperatures.

We experimentally grew a 2.3 micrometers thick epitaxial layer of InAs on an insulating InP substrate using Metal Organic Chemical Vapor Deposition (MOCVD). Hall and magnetoresistance measurements on the layer in the temperature range of 350K to 0.5K, and in magnetic fields up to 7 Tesla, reveal the presence of at least two "types" of carriers, in roughly equal concentrations, but with very different mobilities (by a factor of 2 to 3). In retrospective view of the aforementioned Weider publication, it is reasonable to assume that one of them is the accumulation layer located near the air interface. We built two 2 mm long, 5 mm wide magnetoresistors out of this film which develop a very usable magnetic field sensitivity, while maintaining good temperature stability. We believe it is possible to preserve this sensitivity after covering the InAs surface with a suitable encapsulating coating (e.g., an epoxy or other dielectric).

In a second embodiment, a capping layer of large-gap semiconductor such as GaAs, InP, AlSb, or $In_{1-y}Al_yAs$ can be grown on top of the narrow-gap active layer semiconductor (typically InAs or $In_{1-x}Ga_xAs$ with $0 < X < 0.5$, although a similar structure using InSb can be conceived). In this capping layer, we put donor-type impurities, such as Si, Te, Se, or S. These will release an electron, which will end up in the layer where it has minimum energy, i.e., the narrow-gap semiconductor. This leaves a layer of positively ionized donor-impurities in the large-gap capping layer; but they are spatially removed from the electrons in the active layer, and hence do not significantly scatter them.

Figure 9:
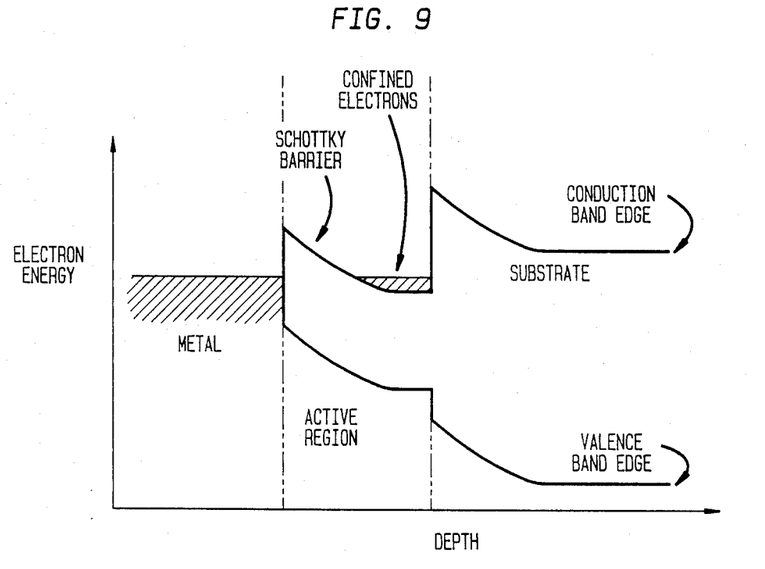
FIGS. 9 and 10 are two-dimensional electron energy to depth plots showing how electrons could be confined in an accumulation layer under special layers on the surface of the sensing area of the magnetoresistor.

In a third embodiment, we propose to deposit a layer of metal on top of the device active region with the purpose of creating a Schottky barrier. A plot of the electron energy levels adjacent the metal-semiconductor interface in this third embodiment is shown in FIG. 9. In referring to FIG. 9, it can be seen that there will be a depletion of the top region of the active narrow-gap semiconductor. If the active layer is thin enough (1000–2000 Angstroms), this will confine electrons in the active layer towards the substrate, resulting in electrical properties similar to those of an accumulation layer. Metals that generally form Schottky barriers to III-V compounds, such as Au or Al, may be useful, although we have not adequately studied this structure experimentally yet.

Figure 10:
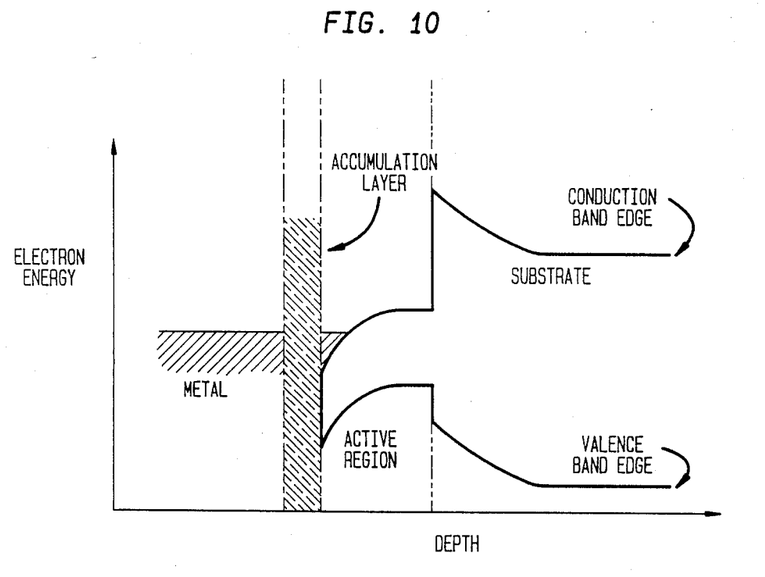
Figure 11A:
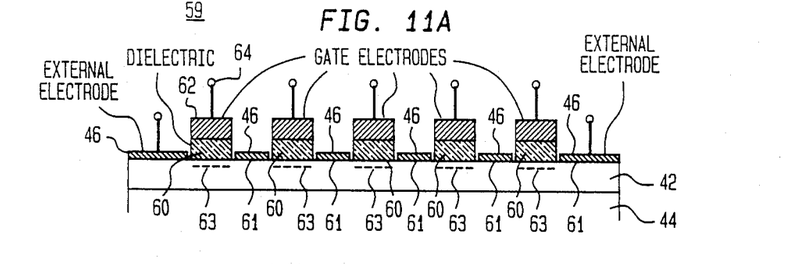

Referring now to FIG. 11A, there is shown a fourth embodiment which shows a cross-sectional view of a plurality of magnetoresistors 59 in accordance with the invention. Magnetoresistors 59 are formed in an epitaxial layer 42 which is on a substrate 44. Spaced-apart electrodes 46 are on a top surface 61 of layer 42. Substrate 44, layer 42 and electrodes 46 are essentially the same as the corresponding components of FIG. 2, which have the same reference numbers with twenty subtracted therefrom. Spaced apart from and between adjacent electrodes 46 are gate electrodes 62, which are each separated from surface 61 by a large gap semiconductor layer or a dielectric layer 60 which is typically $SiO_2$ or $Si_3N_4$. FIG. 10 graphically shows a plot of electron energy versus depth through the relevant interfaces of magnetoresistors 59 of FIG. 11A. A separate one of a plurality of electrical conductors 64 is shown connected to each gate electrode 62. Gate electrodes 62 are typically formed of a metal which can be selected such that it induces an accumulation region (inversion region or layer) 63 (shown as a dashed line in layer 42) under each gate electrode 62. Conversely, gate electrode 62 can have a different metal with a larger work function to deplete the semiconductor dielectric interface and electrostatically confine the electrons near the substrate 44, much as in the third embodiment described hereinabove. The gate electrodes 62 can have voltages applied to same through conductors 64 so as to generate accumulation layers 63 in layer 42. This is typically not a preferred method of operation because it eliminates the simple two-contact aspects of a typical magnetoresistor.

Figure 11B:
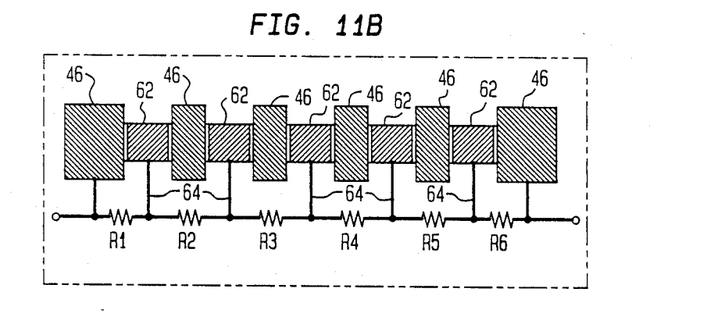

Referring now to FIG. 11B, there is shown a top view of the magnetoresistor 59 of FIG. 11A which has been modified to allow two external contact operations while applying bias voltage to each gate electrode 62 through contacts 64 connected to a series resistor circuit comprising resistors R1, R2, R3, R4, R5 and R6. Since currents drawn into gate electrodes 62 are very small due to the very high ($>10^6$ ohms) input impedance of circuit 59 looking into the gate electrodes 62, the resistors R1 to R6 can have large resistive values. In some applications, resistor R1 can be made very large (essentially an open circuit) and resistors R2, R3, R4, R5 and R6 can be made very small (essentially short circuits). Thus, a full positive bias voltage applied to the electrode 46 on the left in FIG. 11B relative to the electrode 46 on the right is applied to all of the gate electrodes 62.

Figure 11C:
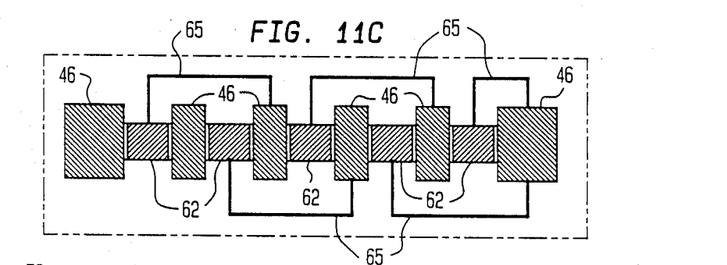

Referring now to FIG. 11C, there is shown a top view of the magnetoresistors 59 of FIG. 11A which has been modified to allow two external contact operations via the use of shorting bars (wires, conductors) 65 between electrodes 46 and gate electrodes 62 to generate accumulation regions under the gate electrodes 62. The magnetoresistors of FIG. 11C can be modified such that each electrode 46 is shorted (electrically connected) to an adjacent contact 62. In this configuration, each of the magnetoresistors might be considered a MISFET transistor with the gate and drain shorted together.

In the five preceding embodiments, the accumulation layers were used only to enhance the desirable transport properties of the semiconductor in the sensing area (i.e., the regions of layer 42 under gate electrodes 64). The geometry of the magnetoresistor, i.e., the length-over-width ratio of each active element, was still defined by the use of metallic shorting bars. The structure of FIG. 11A can be extended to define the geometry of the magnetoresistors themselves, by modulating the carrier density, and hence the conductivity, inside the semiconductor active layer 42. This forms a sixth embodiment of this invention.

Figure 12:
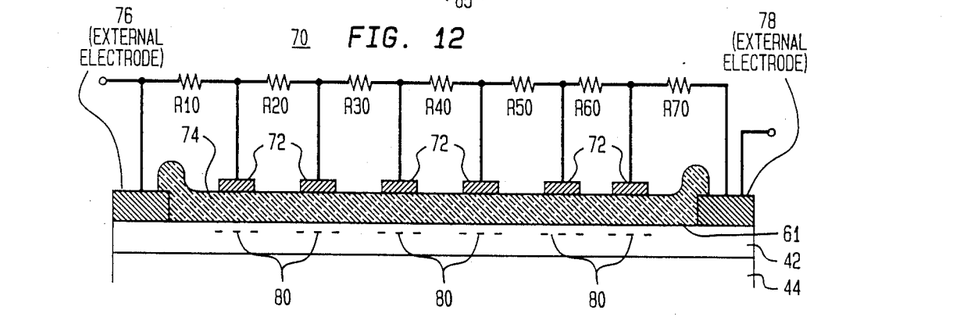
FIG. 12 is a schematic view showing a magnetoresistor having accumulation layers not only in the sensing areas, but also as conductors making electrical contact to the edges of the sensing areas.

Referring now to FIG. 12, there is shown in schematic and cross-sectional form one example of the sixth embodiment of the invention which comprises a magnetoresistor-resistor biasing circuit 70. Circuit 70 comprises a semiconductor substrate 44 on which is formed an epitaxial layer 42, a plurality of spaced-apart electrodes 72 separated from a top surface 61 of layer 42 by a dielectric layer 74, external electrodes 76 and 78 on surface 61 and electrodes 72 which are separated from each other by portions of dielectric layer 74, and a series resistance circuit comprising resistors R10, R20, R30, R40, R50, R60 and R70. Though not shown, the resistors R10–R70 are typically formed in a portion of epitaxial layer 42 or on substrate 44.

A common terminal between adjacent resistors (e.g., the common terminal of resistors R10 and R20) is coupled to a separate one of electrodes 72. A non-common terminal of resistor R10 is coupled to external electrode 70, and a non-common terminal of resistor R70 is coupled to external electrode 78.

With a voltage difference established between external electrodes 76 and 78, the electrodes 72 are biased such that strong accumulation regions (shown as dashed lines) 80 are formed within portions of layer 42 which are under electrodes 72. These strong accumulation regions essentially act in the same way as electrodes 46 of FIG. 11A and thus define the geometry of the magnetoresistors formed in layer 42. These accumulation regions 80 can be used instead of metallic shorting bars to create geometrical magnetoresistance. Such a structure could potentially be superior to one in which metallic shorting bars (electrodes) are used, because field-insensitive contact resistances between the metal and the semiconductor would be eliminated.

Circuit 70 can be modified such that the resistor R10 is open-circuited (i.e., a very high impedance) and the other resistors (R20–R70) are short circuited (very low impedances) so that essentially all of the positive bias applied to one external electrode 70 is also applied to each electrode 72. Thus, the natural accumulation layer normally present on an InAs surface would exist between the electrodes 72 as exists under gate electrodes 62 of circuit 59 of FIG. 11A, but have a lower electron density. If desired, the electrodes 72 could be biased negatively to eliminate the electron accumulation layers between the electrodes 72, or even to generate a strong inversion layer with carriers of the opposite type (holes). While the emphasis of this record of invention is on devices with only two external leads, the gates could be connected through a resistor network to a third external lead, making this version of the magnetic field sensor externally controllable through a voltage bias externally supplied. As hereinbefore indicated, a similar three-terminal device could be made with the device shown in FIG. 11A.

In a seventh embodiment, a lightly p-type film is grown (typically doped with Zn, Cd, Mg, Be, or C). In the case of InAs, the surface would, we believe, still have a strongly degenerate electron layer, but it would be an inversion layer Such an inversion layer would have a large electron density near the surface, and then a relatively thick (typically about 0.1 micrometer to 1 micrometer or more, depending on dopant density) region of very low carrier density, similar to the space charge region of an n+/p junction. This might be advantageously used to reduce the conductivity of the film adjacent to the electron strong inversion layer. At very high device operating temperatures, the intrinsic carrier density of narrow energy gap semiconductors like InAs would tend to defeat this strategy somewhat, and other, higher energy gap semiconductors such as $In_{1-x}Ga_xAs$ might be preferred (see Table I). $In_{0.53}Ga_{0.47}As$ is a special case, since it can be lattice-matched to semi-insulating InP substrates. This makes it easier to grow such films with high crystalline quality.

The acceptor dopants mentioned above (i.e., Zn, Cd, Mg, Be, and C) have small activation energies in the III-V compounds of interest (see Table I). However, there are other acceptor dopants with relatively large activation energies, such as Fe, in $In_{0.53}Ga_{0.47}As$. This means that relatively large thermal energy is required to make the iron ionize and contribute a hole to conduction. However, the iron will compensate a concentration of donor impurities frequently present in the material so that they do not contribute electrons to the conduction band. Thus, doping this material with iron will make it tend to have a high resistivity, except in the electron-rich accumulation layer. It would in this case be desirable to grow a thin undoped $In_{0.53}Ga_{0.47}As$ layer (e.g., 0.1 micrometer thick, after correcting for iron diffusion effects) on top of the iron doped layer in order to obtain the highest possible electron mobility and density in the accumulation layer. It is recognized, however, that finding suitable dopants with large activation energies may not be practical for smaller band gap semiconductive materials. Furthermore, the other embodiments discussed above could also be used in conjunction with this one advantageously to reduce the conductivity of the film adjacent to the high electron density region.

The emphasis of the above discussion has been on electron accumulation or inversion layers. Hole accumulation or inversion layers could also be used. However, electrons are usually preferred as current carriers in magnetoresistors since they have higher mobilities in the materials shown in Table I.

We think that these types of magnetoresistors are especially attractive for automotive applications as part of linear or rotary position measurement systems. The sensitivity to magnetic field and high thermal stability of these sensors would be especially useful when used in combination with an optimized magnetic circuit which is described in U.S. patent application Ser. No. 229,396, filed 8 August 1988, in the names of Thaddeus Schroeder and Bruno Lequesne, and entitled, "Position Sensor." It is believed that the selection of the hereinbefore described type of magnetoresistor sensor is especially useful in the Schroeder and Lequesne type of magnetic circuit. We believe that our invention will enhance the magnetic sensitivity of magnetoresistors made from a wide variety of materials, including InAs and InSb. Many of these materials may not produce sensors having high magnetic sensitivity to be preferred for use at lower temperatures. However, their magnetic sensitivity may extend up to higher temperatures where high magnetic sensitivity materials are not useful. However, we and others believe that the Schroeder and Lequesne type of magnetic circuit is so effective in concentrating the magnetic field that the lesser sensitive magnetoresistors may still work well enough to be useful. In addition, they would permit use of the Schroeder and Lequesne type of circuit at decidedly higher temperatures. The temperature at which the artificially induced accumulation layer of this invention no longer will provide a magnetic sensitivity enhancement varies from material to material. It varies because the band gap of each material will determine the temperature at which thermally generated carriers in the bulk of the film will dominate conductivity over carriers in the artificially induced accumulation layer. When they do, they will mask the enhancement produced by the artificially induced accumulation layer.

In any event, it is believed that use of our sensors in such an application should provide many advantages. A separate U.S. patent application Ser. No. 289,641 entitled, "Improved Position Sensor," was filed Dec. 23, 1988 in the names of Donald T. Morelli, Joseph P. Heremans, Dale L. Partin, Christopher M. Thrush and Louis Green on this latter use of our sensors. A continuation-in-part of U.S. patent application Ser. No. 289,641 is being filed concurrently with this patent application.

The embodiments of the invention in which an exclusive property or privilege is claimed are defined as follows:

1. A magnetoresistive sensor providing unamplified electrical output changes of the order of one volt in response to changes in an applied magnetic field even when exposed up to temperatures over 220° C., said magnetoresistive sensor comprising:
   a substantially electrically insulating monocrystalline substrate having a thermal expansion characteristic close to that of indium arsenide;
   a material forming the surface of said substrate that has a crystal lattice constant close to that of a semiconductive material to be deposited onto said surface;
   a monocrystalline thin film of said semiconductive material disposed on said substrate surface, said thin film having inner and outer surfaces;
   said monocrystalline thin film being of a semiconductive material having only a moderate average current carrier density and moderate average current carrier mobility, and a band gap of at least 0.36 electron volt;
   said monocrystalline semiconductive thin film including a substantially rectangular sensing area for sensing a magnetic field applied perpendicularly to said film surfaces, said sensing area being defined as the entire area of said film disposed between the shorter, if they are not of equal length, of two parallel highly conductive portions in low electrical resistance contact with film portions adjacent the film outer surface;
   said rectangular sensing area having two long edges of substantially equal length and two short edges of substantially equal length in which the length of the short edges is about 10% to 60% of the length of the long edges, and one of said two parallel conductors extends along the length of each long edge; and
   an accumulation layer artificially induced in said thin film extending across said sensing area and disposed adjacent a surface of said thin film, where said current carriers can preferentially flow between said highly conductive portions contacting opposed edges of said sensing area;
   effective to provide an apparent increase in carrier mobility and concentration in said semiconductive material, an apparent reduction in thickness of said film, and an actual improvement in the magnetic sensitivity of said film and in temperature insensitivity of the magnetic sensitivity of said film.

2. The magnetoresistive sensor of claim 1 in which said substrate includes a plurality of said thin film sensing areas, and said plurality of sensing areas are electrically in series.

3. The magnetoresistive sensor of claim 1 in which said monocrystalline semiconductive thin film has an elongated portion, the elongated portion comprises a plurality of successive sensing areas, each successive sensing area extends across the width of the elongated portion, the sensing areas are electrically in series, and a conductive coating extends completely across said elongated portion between adjacent ones of said successive sensing areas, whereby power consumption of said sensor is significantly reduced but sensor size is not significantly increased.

4. A magnetoresistive sensor providing significant unamplified electrical output changes in response to changes in applied magnetic field, said magnetoresistive sensor comprising:
   a substrate having a thermal expansion characteristic close to that of a semiconductive material on said substrate;
   a surface on said substrate that is substantially electrically insulating and monocrystalline, and which contains few crystal defects and has a crystal lattice constant close to that of said semiconductive material;
   a monocrystalline film of said semiconductive material on said substrate surface;
   said film including a substantially rectangular sensing area having a dimension along its short edges that is about 10% to 60% that of its long edges;
   a first electrical conductor on said film extending along the length of one of the long edges of the rectangular sensing area;
   a second electrical conductor on said film extending along the length of the other of the long edges of the rectangular sensing area;
   said film of semiconductive material being less than about 5 micrometers thick and nominally undoped, and having a given average electron density and a given average electron mobility;
   an artificially induced or enhanced electron accumulation layer adjacent the outer surface of said semiconductive film and extending entirely across the sensing area between the conductors contacting its long edges, which accumulation layer has an electron density at least an order of magnitude higher than said given average electron density and an electron mobility that is significantly greater than said given average electron mobility, and which is effective to provide a magnetic sensitivity and range of operating temperature as if the semiconductive thin film were much thinner and had a much higher electron density and electron mobility; and means adjacent the surface of said semiconductive thin film for artificially inducing or enhancing said accumulation layer in said semiconductive thin film.

5. The magnetoresistive sensor of claim 4 in which said monocrystalline thin film of semiconductive material has an elongated portion, the elongated portion comprises a plurality of successive sensing areas, each successive sensing area extends across the width of the elongated portion, the sensing areas are electrically in series, and a conductive coating extends completely across said elongated portion between adjacent ones of said successive sensing areas, whereby power consumption of said sensor is significantly reduced but sensor size is not significantly increased.

6. The magnetoresistive sensor of claim 5 in which the plurality of sensing areas is a plurality of over ten and the conductive coating over the sensing area is a metal gate electrode disposed on a dielectric layer.

7. The magnetoresistive sensor of claim 4 in which the semiconductor material is an arsenide or antimonide of indium.

8. The magnetoresistive sensor of claim 7 in which the semiconductor material is indium antimonide.

9. A magnetoresistive sensor providing significant changes in electrical resistance is in response to changes in applied magnetic field over a temperature range of from below 0° C. to over 300° C., said magnetoresistive sensor comprising:

a substrate having a thermal expansion characteristic close to that of an overlying film of semiconductive material;

a surface on said substrate that is substantially electrically insulating and monocrystalline, and which contains few crystal defects and has a crystal lattice constant close to that of said semiconductive material;

a monocrystalline film of a semiconductive material on said substrate surface and having a film outer surface;

said film of semiconductive material having a substantially rectangular sensing area exposed on its surface, said sensing area having a dimension along its short edges that is about 10% to 60% that of its long edges;

a first electrical conductor on said film extending along the length of one of the long edges of the rectangular sensing area;

a second electrical conductor on said film extending along the length of the other of the long edges of the rectangular sensing area;

said monocrystalline film of semiconductive material being about 1 to 3 micrometers thick and nominally updoped, and having a band gap of at least about 0.36 electron volt, a moderate average electron density and moderate average electron mobility;

an electron accumulation layer adjacent the film outer surface and extending entirely across the sensing area between the conductors contacting its long edges, which accumulation layer has an electron density at least an order of magnitude higher than said average electron density and an electron mobility significantly greater than said average electron mobility and which is effective to provide a magnetic sensitivity and range of operating temperature as if said thin film were much thinner and said semiconductive material had a much higher electron density and electron mobility; and coating means on the exposed sensing area of said film surface for artificially inducing and maintaining said accumulation layer in said thin film.

10. The magnetoresistive sensor of claim 9 in which said means for inducing said accumulation layer in said thin film is a coating on said film surface, which coating includes a discrete portion of a metal layer over said sensing area.

11. The magnetoresistive sensor of claim 9 in which said coating means for inducing said accumulation layer in said thin film includes an electrode layer, the electrode layer disposed over said sensing area, and said electrode is electrically biased when an electrical potential is applied to one of said conductors contacting the long edges of said sensing area.

12. The magnetoresistive sensor of claim 9 in which said monocrystalline film of semiconductive material has an elongated portion, the elongated portion comprises a plurality of successive sensing areas, each successive sensing area extends across the width of the elongated portion, the sensing areas are electrically in series, and a conductive coating extends completely across said elongated portion between adjacent ones of said successive sensing areas, whereby power consumption of said sensor is significantly reduced but sensor size is not significantly increased.

13. The magnetoresistive sensor of claim 10 in which said substrate includes a plurality of said thin film sensing areas, said plurality of sensing areas are electrically in series, and said coating induces said accumulation layer in said film without application of a voltage from an electrical contact to said sensor in addition to respective electrical contacts made to said sensing area conductors.

14. The magnetoresistive sensor of claim 13 in which each end of said elongated portion of said film has an electrical contact for electrically biasing said sensing areas in series, said substrate includes a resistor network, and said resistor network is interconnected with said metal layer discrete portions and said electrical contacts to concurrently electrically bias said metal layer portions with respect to their respective sensing areas of said film when said sensing areas are biased, effective to concurrently induce or enhance said accumulation layer in said film.

15. A magnetoresistive sensor comprising:

a thin film of nominally undoped monocrystalline semiconductive material having a band gap of at least about 0.36 electron volt and supported on a substantially electrically insulating monocrystalline substantially lattice-matching substrate;

said thin film having a thickness of less than about 3 micrometers and a generally rectangular sensing area;

substantially parallel conductors contacting said thin film for injecting current carriers into opposed edges of said sensing area;

said sensing area having a dimension in a direct path between said conductors that is significantly shorter than its dimension parallel to said conductors, so as to provide a current flow path diagonally in said sensing area that is longer than said direct path; and said sensing area including means for artificially inducing or enhancing an accumulation layer in said film that provides a magnetic sensitivity and temperature insensitivity as if the film were at least an order of magnitude thinner, had an electron density at least an order of magnitude greater, and a significantly higher electron mobility.

16. The magnetoresistive sensor of claim 15 in which the semiconductor material is an arsenide or antimonide of indium.

17. The magnetoresistive sensor of claim 16 in which the semiconductor material is indium antimonide.